(12) United States Patent
Hansen

(10) Patent No.: US 6,490,535 B1
(45) Date of Patent: Dec. 3, 2002

(54) METHOD AND APPARATUS FOR CALIBRATING AN INSTRUMENT

(75) Inventor: Victor L. Hansen, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/293,493

(22) Filed: Apr. 15, 1999

(51) Int. Cl.[7] .............................................. G01R 35/00
(52) U.S. Cl. ........................ 702/107; 702/106; 702/75; 324/601
(58) Field of Search ............................. 702/107, 57–59, 702/67, 64–66, 69, 71, 74–80, 85, 106, 108–112, 117, 118, 124, 189, 182–185, 194, 199, FOR 103, FOR 104, FOR 106–FOR 110, FOR 134, FOR 135, FOR 155–FOR 165, FOR 167–FOR 171; 324/76.45, 76.19, 76.21, 76.22, 76.39, 76.41, 76.11, 76.12, 601, 602–606, 608, 674, 667, 681, 684; 708/309, 311, 403–405, 323

(56) References Cited

U.S. PATENT DOCUMENTS 4,789,952 A * 12/1988 Lo et al. ...................... 708/323
4,802,098 A * 1/1989 Hansen et al. ................. 702/67
5,731,984 A * 3/1998 Ullmann ....................... 702/67

* cited by examiner

*Primary Examiner*—Hal Wachsman
(74) *Attorney, Agent, or Firm*—David N. Caracappa; Thomas F. Lenihan

(57) ABSTRACT

A method for calibrating an instrument includes maintaining typical response values at respective frequency locations. The response of the instrument being calibrated is measured at a subset of frequency locations in the typical response. Response values for frequency locations not in the subset are estimated from the typical and measured response values. The instrument is calibrated based on the actual and estimated response values. Apparatus for calibrating an instrument includes a signal generator, coupled to the instrument, which generates a signal having known characteristics. A controller, coupled to the instrument, generates a calibration signal. Controller memory stores typical response values at respective frequency locations, and measures response values at a subset of the frequency locations. Response values for frequency locations not in the subset are estimated from the typical and measured response values. The instrument is calibrated in response to the measured and estimated response values.

10 Claims, 2 Drawing Sheets

METHOD AND APPARATUS FOR CALIBRATING AN INSTRUMENT

FIELD OF THE INVENTION

The present invention relates to calibrating electronic equipment, and in particular to a method and apparatus for allowing faster calibration of a measuring instrument.

BACKGROUND OF THE INVENTION

It is well known that analog circuitry provides operating characteristics which vary from circuit to circuit and over time. In measuring instruments (e.g oscilloscopes), in particular, it is important that such variations in operating characteristics be minimized, both from instrument to instrument and over time, in order to maintain accuracy and repeatability of the measurements. Various methods have been proposed.

Such measurement instruments were provided with signal compensation circuitry whose characteristics were specified to compensate for any variation in operating characteristics of the analog circuitry. Early solutions added analog filters to the analog measurement circuitry. The characteristics of the filters were controlled to compensate for the operating characteristic variation in the analog measurement circuitry. But these filters suffered the same variations as the analog measurement circuitry. Later solutions substituted a digital filter for the analog filter. The characteristics of the digital filters did not vary from instrument to instrument, nor over time.

Some implementations included controlled digital filters whose characteristics could be varied. This allowed each instrument to be compensated separately for the particular operating characteristics of its analog circuitry. This also allowed for the measurement instrument to be recalibrated as desired by readjusting the operating characteristic of the digital filter as the operating characteristic of its analog circuitry varied over time.

U.S. Pat. No. 4,789,952, entitled "Method and Apparatus for Digital Compensation and Digital Equalization", issued Dec. 6, 1988 to Lo et al. illustrates such a system. In Lo et al., a training function generator provides a training signal having known characteristics to the input terminal of a signal acquisition circuit including analog and digital circuitry. The output signal from the signal acquisition circuit is supplied to an adaptive digital filter, which acts as the signal compensating circuit. Both the training signal from the training function generator and the output from the adaptive digital filter are supplied to a controller. The controller compares the training signal to the output of the adaptive digital filter produced in response to the training signal. Control parameters for the adaptive digital filter are calculated in the controller so that the combination of the signal acquisition circuit and adaptive digital filter exhibits the desired operating characteristic, i.e. so that the output of the adaptive digital filter is the desired function of the training signal. After the parameters of the adaptive digital filter are set in this manner, the training function generator and controller are disconnected from the remaining circuitry. The system then receives an input signal at the input of the signal acquisition circuit and produces an output at the output of the adaptive digital filter which will exhibit substantially the desired operating characteristic.

Methods for generating the control parameters for the adaptive digital filter in the controller (e.g. as illustrated in Lo et al.) are complex and take a relatively long time to compute. Furthermore, to increase the accuracy of the signal compensation, more samples of the training signal must be measured and processed. However, the more samples of the training signal which are measured and processed, the longer the time necessary to generate the control parameters.

When an instrument is used to make amplitude measurements of AC signals, for example, it is necessary to maintain the accuracy of the response of that instrument over a desired range of frequencies. In order to provide compensation, samples of the response of the instrument at a plurality of respective frequency locations are measured and analyzed to generate the parameters of the signal compensation circuitry. Decreasing the number of frequency locations at which the response of the instrument must be measured can significantly decrease the time necessary to generate the adaptive digital filter control parameters. However, this also decreases the accuracy of the compensation. On the other hand, response values for sufficient frequency locations to generate the adaptive digital filter control parameters to the required accuracy increases the time necessary to calculate the control parameters for the adaptive digital filter. In a production environment, in which a large volume of instruments must be tested and accurately compensated, this increased time period slows the production rate. It is desirable to decrease the time necessary to generate the parameters for the signal compensating circuitry while maintaining the accuracy of the compensation.

BRIEF SUMMARY OF THE INVENTION

The inventor realized that in frequency ranges where the response characteristic of the measurement instrument is changing relatively quickly the frequency locations at which the response of the instrument is taken must be relatively closely spaced to maintain the desired accuracy of compensation. However, in frequency ranges where the response characteristic of the measurement is relatively unchanging, such frequency locations may be spaced relatively far apart, and still maintain the desired accuracy. In this manner, the number of frequency locations at which the response of the instrument must be measured may be minimized. Response values for intermediate frequency locations, where necessary to calculate the compensating control parameters, may be estimated.

The inventor also realized that in a production setting the design of the measurement instrument is fixed, and the design of the analog circuit is identical from instrument to instrument. The inventor realized that in such a setting, the response characteristics from instrument to instrument are not identical, but they are very similar. Thus, a typical response characteristic may be generated by averaging, by any of a number of known statistical methods, the response characteristics of a plurality of instruments. This typical response characteristic, in combination with the measured response values at the minimum number of frequency locations for the instrument being calibrated, may be used to generate the parameters for the signal compensating circuitry.

In accordance with principles of the present invention, a method for calibrating an instrument includes the following steps. First, a plurality of typical response values at respective frequency locations is maintained. Then the response of the instrument being calibrated is measured at a subset of the respective frequency locations in the typical response. A response value for a frequency location not in the subset of frequency locations is estimated from the typical response values and the measured response values. Then the instrument is calibrated based on the actual and estimated response values.

In accordance with another aspect of the invention, a calibrator for calibrating an instrument includes a signal generator, coupled to the instrument, which generates a signal having known characteristics. A controller is also coupled to the instrument and generates a calibration signal for the instrument. The controller includes a memory for storing a plurality of typical response values at respective frequency locations. The controller also includes circuitry which measures a plurality of response values at a subset of the respective frequency locations. An estimator in the controller estimates a response value at a frequency location not in the subset of frequency locations in response to the typical response values and the measured response values. Finally, the instrument is calibrated by circuitry in the controller which is responsive to the measured and estimated response values.

DETAILED DESCRIPTION OF THE INVENTION

Figure 1:
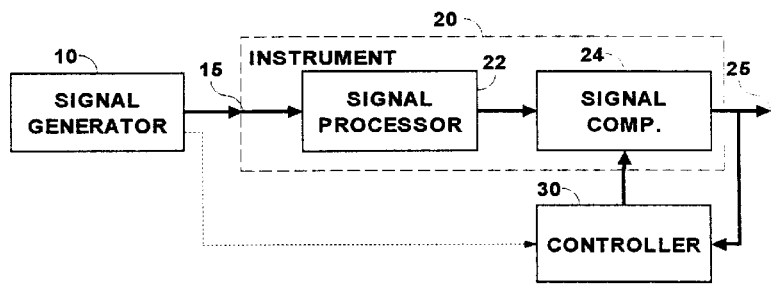
FIG. 1 is a block diagram of a system for calibrating a measurement instrument in accordance with principles of the present invention.

FIG. 1 is a block diagram of a system for calibrating a measurement instrument in accordance with principles of the present invention. In FIG. 1, only the circuitry necessary to understand the present invention is illustrated. One skilled in the art will understand that other elements are present in the measurement instrument, what those elements are, and how they are interconnected with those elements illustrated in FIG. 1. In FIG. 1, a signal generator 10 generates a signal having known characteristics. An output terminal of the signal generator 10 is coupled to an input terminal 15 of a measurement instrument 20. An output terminal 25 of the measurement instrument 20 is coupled to an input terminal of a controller 30. The serial connection of a signal processor 22 and a signal compensating circuit 24 is coupled between the input terminal 15 and the output terminal 25 of the measurement instrument 20. An output terminal of the controller 30 is coupled to a control input terminal of the signal compensating circuit 24.

In operation, the signal processor 22 processes an input signal received at input terminal 15 and exhibits an operating characteristic which varies from unit to unit, and over time. The signal compensating circuit 24 is controlled to compensate for the operating characteristic of the signal processor 22 in a known manner. The combination of the signal processor 22 and signal compensating circuit 24 processes an input signal with substantially a predetermined desired operating characteristic and produces an output signal at the output terminal 25.

The combination of the signal generator 10 and the controller operate as a calibrating system to control the signal compensating circuit 24 to properly compensate for variations in the operating characteristics in the signal processor 22. In operation, the signal generator 10 supplies a test signal to input terminal 15 of the measurement instrument 20. The measurement instrument 20 processes that test signal through the serial connection of the signal processor 22 and the signal compensating circuit 24. The controller 30 analyzes the processed test signal at output terminal 25 to determine the variation of that signal from the desired signal, and generates proper parameters for the signal compensating circuit 24 to compensate for the operating characteristic of the signal processor 22.

In the illustrated embodiment, the signal compensating circuit 24 includes a controllable adaptive digital filter (not shown). The controller 30 samples the processed test signal to produce measured frequency response data at desired frequency locations. The controller then sends filter parameters to the controllable adaptive digital filter to compensate for the measured frequency response. The action of the controllable adaptive digital filter is to adjust the frequency response so it matches the desired frequency response.

Figure 2:
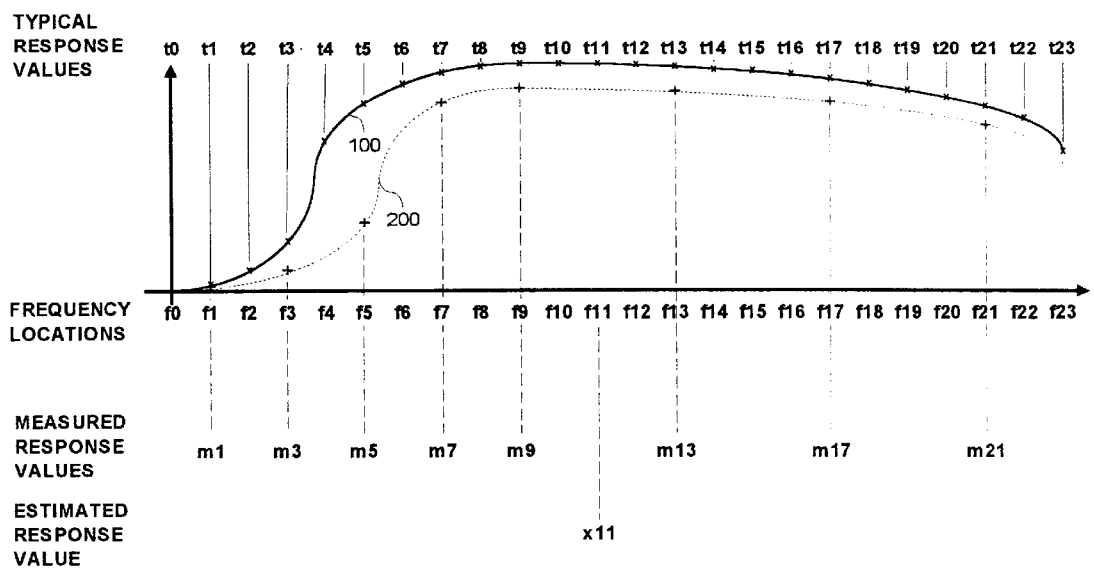
FIG. 2 is a diagram of response characteristics for a measurement instrument, and is useful in understanding the operation of the calibrating system illustrated in FIG. 1.

The operation of the calibrating system in FIG. 1 may be better understood by reference to the response characteristics illustrated in FIG. 2. The controller 20 includes a memory (not shown) which stores data representing a typical response characteristic for the measurement instrument 20 including a plurality of typical response values at respective frequency locations. In FIG. 2, the typical frequency response characteristic is illustrated as curve 100. The frequency axis is the horizontal axis and the response value axis is the vertical axis. The response value may, for example, be a voltage or current or any other signal characteristic which varies over frequency and must be controlled to a desired predetermined frequency characteristic.

The frequencies at which the typical response values are stored are designated as f0 (DC), f1, f2, . . . f23. The plurality of typical response values, corresponding to these frequencies are represented by "x"s on the frequency response curve 100, and are designated t0, t1, t2, . . . t23, respectively. These typical response values may be obtained by analyzing the response characteristics of a plurality of properly compensated measurement instruments in known statistically valid methods. The typical response characteristic values may be generated by any of a number of known statistical aggregates (such as, for example, an average) of the respective response characteristics of the plurality of those measurement instruments When a measurement instrument 20 is tested, the controller 30 analyzes the processed test signal. In the illustrated embodiment, data representing the frequency characteristic of the unit being tested is measured. The frequency response of the unit being tested is represented in FIG. 2 as curve 200. The response values at a subset of the frequency locations in the typical response characteristic are measured by the controller 30. The frequencies at which the measured response values are measured are f1, f3, f5, f7, f9, f13, f17, and f21. The plurality of measured response values are represented by "+"s on the frequency response curve 200, and are designated m1, m3, m5, m7, m9, m13, m17 and m21, respectively. One skilled in the art will understand that the test signal can be either a broadband signal (such as a random or pseudo-random signal) having significant energy at all frequencies of interest, or can be a sequence of signals at each of the frequencies of interest.

As described above, while the measured response characteristic 200 will vary from the typical response characteristic 100, they will be similar, as can be seen in FIG. 2. Where the frequency response varies relatively rapidly, as at the left hand side of the frequency response curves 100 and 200, the frequencies at which response values are measured must be more closely spaced to maintain the required accuracy of compensation. Where the frequency response varies relatively slowly, as at the right hand side of the frequency response curves 100 and 200, the frequencies at which response values are measured may be more widely spaced and still maintain the required accuracy.

Consequently, at the left hand side of the frequency response curve 200, the measured response values m1–m9 are taken at relatively closely spaced frequencies f1–f9, respectively; and at the right hand side of the frequency response curve 200, the measured response values m13–m21 are taken at relatively widely spaced frequencies f13–f21. By taking actual measurements at frequency locations only spaced only as closely as necessary to maintain the required accuracy, the number of measurements may be minimized, and thus the time required to test and adjust the measurement instrument being tested to compensate for variation in the operating characteristic, may similarly be minimized.

The method for generating the compensating parameters for the controlled adaptive digital filter may require response values equally spaced in frequency, however. In order to provide such equally spaced response values, intermediate response values, at frequency locations which are not among the subset of frequency values (f1, f3, f5, f7, f9, f13, f17 and f21) for which response values are measured are estimated in a manner to be described below. For example, in FIG. 2, a response value at the frequency location f11 is estimated. This estimated response value is designated x11.

The estimated response value x11 is estimated based both on the measured response values (m1, m3, m7, m9, m13, m17, and m21) and on the typical response values (t1–t23). In order to estimate the response value at frequency f11, a first value, designated g0, is calculated as shown in equation (1). A $$g0 = \frac{m9}{t9} \quad (1)$$

second value, designated g1 is calculated as shown in equation (2). The values g0 and g1 from equations (1) and (2), represent $$g1 = \frac{m13}{t13} \quad (2)$$

the relationship between the respective measured frequency responses m9 and m13, and the typical frequency responses t9 and t13 at the two frequency locations, f9 and f13, adjacent to the frequency location f11 of the estimated response value x11. A third value, designated p, is calculated as shown in equation (3). The value p represents the spacing of the frequency $$p = \frac{(f11 - f9)}{(f13 - f9)} \quad (3)$$

location f11 of the estimated response value x11 relative to the two adjacent frequency locations, f9 and f13, at which measured response values, m9 and m13, are available. A value s is calculated as shown in equation (4). The value s represents $$s = g0 + (p \times (g1 - g0)) \quad (4)$$

the relationship between the typical response value t11 and the estimated response value x11 at the frequency location f11 of the estimated response value x11. The estimated response value x11 is calculated as shown in equation (5). In this manner, $$x11 = s \times t11 \quad (5)$$

the estimated response value x11 is interpolated between the two frequency adjacent measured values m9 and m13, scaled to the typical response value t11 at the frequency location of the estimated response value.

This estimated response value x11 can then be used, in conjunction with the measured response values m1–m21 and other estimated values xn, to produce a measured response characteristic curve 200. The measured response characteristic curve 200, in turn, may be used to generate compensation parameters for the controlled adaptive digital filter in the signal compensating circuit 24.

It can be seen from equations (1) through (5) that as the frequency location of the estimated response value approaches the frequency location of either of the adjacent measured response values, the estimated response value approaches the value of that measured response value, which is a desirable result.

As can be seen from FIG. 2, the frequency response is measured at only eight frequency locations out of the twenty three illustrated. Response values for all other frequency locations may be estimated from the measured response values, and the stored typical response values. Because it is substantially faster to estimate response values than to measure them, this can decrease the time necessary to calibrate a measurement instrument. To further decrease the time necessary for calibration of measurement instruments in a production environment, each measurement instrument is initially tested to determine of the instrument falls within an expected acceptable range of performance. Only if the instrument does not fall within the acceptable range is a full calibration performed on that instrument. This further reduces the average time necessary for calibration on the production line.

Figure 3:
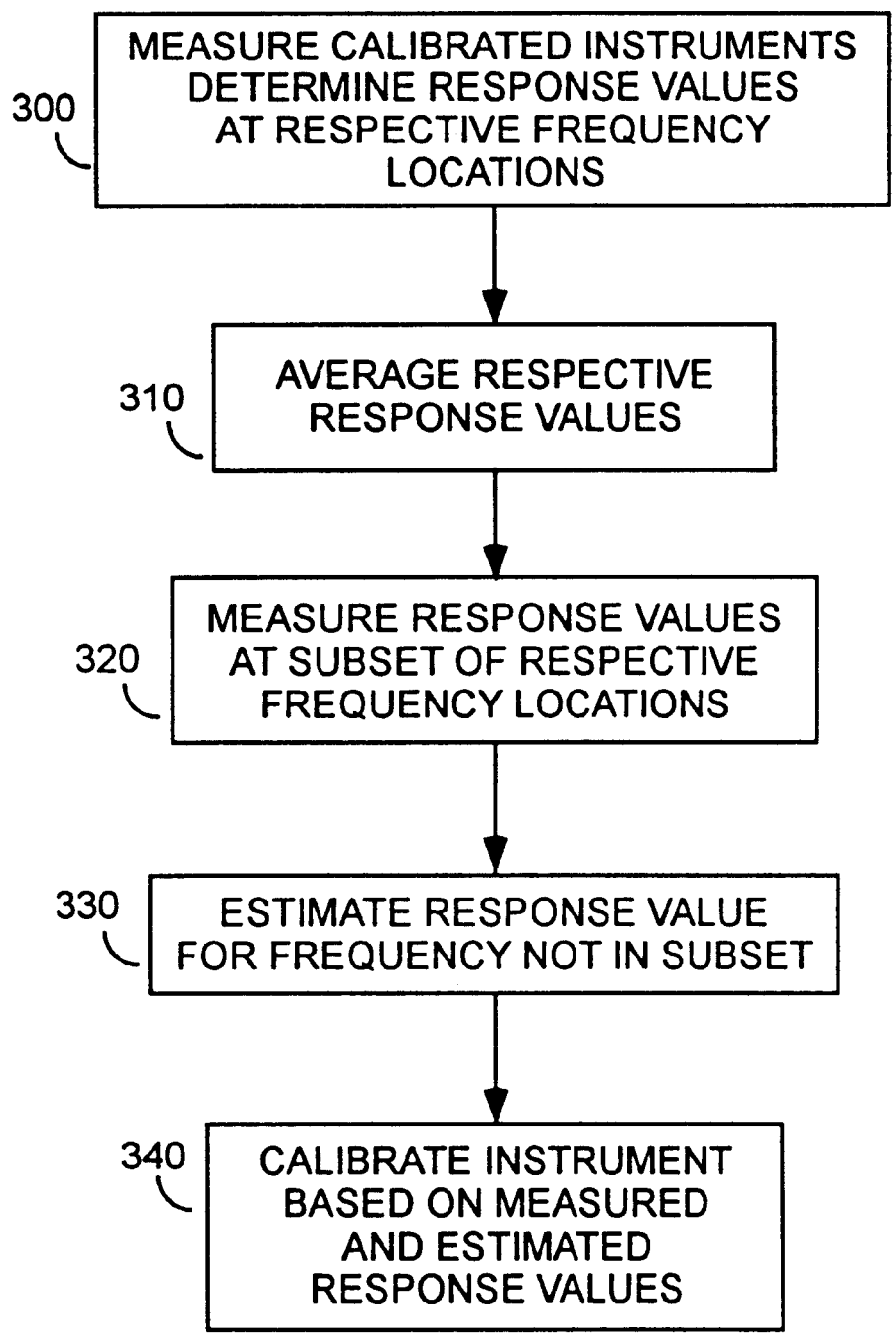
FIG. 3 shows a flowchart illustrating a method of practicing the subject invention.

The flowchart of FIG. 3, illustrates a method of practicing the subject invention. In step 300, calibrated instruments are measured and response values at respective frequency locations are determined. In step 310 respective response values are averaged. In step 320, Response values at a subset of respective frequency locations are measured. At step 330, estimates of response values are produced for those frequencies not in the subset, and finally, at step 340, the instrument is calibrated based upon both the measured and estimated response values.

The embodiment illustrated in this application has stored a typical response characteristic with response values at equally spaced frequency locations. One skilled in the art will understand that the frequency locations may be arbitrarily spaced. The illustrated embodiment also provides estimated response values only at frequency locations at which typical response values have been previously determined and stored. One skilled in the art will understand how to modify the interpolation processes described above to permit estimating and storing response values at arbitrary frequency locations.

What is claimed is:

1. A method for calibrating an instrument, comprising the steps of:

maintaining a plurality of typical response values at respective frequency locations, said maintaining step including the steps of measuring a plurality of calibrated instruments to determine respective response values at the respective frequency locations and aggregating the respective response values of the plurality of calibrated instruments to form the typical response values;

measuring a plurality of response values of the instrument at a subset of the respective frequency locations;

estimating a response value for a frequency location not in the subset of respective frequency locations from the typical response values and the measured response values, said estimating step including the step of interpolating between the measured response values at frequency locations adjacent the frequency location of the estimated response value; and calibrating the instrument by adjusting a frequency response of said instrument in response to the measured and estimated response values.

2. The method of claim 1 wherein the aggregating step comprises the step of:

averaging the respective response values of the plurality of calibrated instruments at the respective frequency locations to form the typical response values.

3. The method of claim 1, wherein the measuring step comprises the step of:

measuring first response values of the instrument at respective frequency locations relatively closely spaced where said first response values change relatively rapidly and measuring second response values at respective frequency locations relatively widely spaced where said second response values change relatively slowly.

4. The method of claim 1, wherein the interpolating step comprises the steps of:

calculating first data representing the relationship between a measured response value at a first frequency location adjacent the frequency location of the estimated response value and a typical response value at the first frequency location;

calculating second data representing the relationship between a measured response value at a second frequency location adjacent the frequency location of the estimated response value and a typical response value at the second frequency location; calculating third data representing the location of the frequency location of the estimated response value relative to the first and second frequency locations;

calculating fourth data representing the relationship between a typical response value at the frequency location of the estimated response value and the estimated response value based on the first, second and third data; and calculating the estimated response value based on the typical response value at the frequency location of the estimated response value and the fourth data.

5. The method of claim 4, wherein:

the step of calculating the first data comprises calculating $g0=m9/t9$ where $g0$ is the first data, $m9$ is the measured response value at the first frequency location and $t9$ is the typical response value at the first frequency location;

the step of calculating the second data comprises calculating $g1=m13/t13$ where $g1$ is the second data, $m13$ is the measured response at the second frequency location and $t13$ is the typical response value at the second frequency location;

the step of calculating the third data comprises calculating $p=(f11-f9)/(f13-f9)$ where $p$ is the third data, $f11$ is the frequency location of the estimated response value, $f9$ is the first frequency location and $f13$ is the second frequency location;

the step of calculating the fourth data comprises calculating $s=g0+(p\times(g1-g0))$ wherein $s$ is the fourth data; and the step of calculating the estimated response value comprises calculating $x11=s\times t11$ where $x11$ is the estimated response value and $t11$ is the typical response value at the frequency location of the estimated response value.

6. A calibrator for calibrating an instrument, comprising:

a signal generator, coupled to the instrument, for generating a signal having known characteristics;

a controller, coupled to the instrument, for generating a calibration signal for the instrument, and comprising:

a memory for storing a plurality of typical response values at respective frequency locations;

circuitry, coupled to the instrument, for measuring a plurality of response values at a subset of the respective frequency locations;

an estimator, responsive to the typical response values and the measured response values for estimating a response value at a frequency location not in the subset of respective frequency locations, said estimator comprising an interpolator for interpolating between measured response values at frequency locations adjacent to the frequency location of the estimated response value to produce the estimated response value; and compensating circuitry, responsive to the measured and estimated response values, for calibrating the instrument by adjusting its frequency response.

7. The calibrator of claim 6 wherein the signal generator produces a signal at the respective frequency locations.

8. The calibrator of claim 6 wherein the measuring circuitry measures response values at frequency locations relatively closely spaced where the response values vary relatively quickly, and measures response values at frequency locations relatively widely spaced where the response values vary relatively slowly.

9. The calibrator of claim 6 wherein the interpolator comprises:

a first calculating circuit for calculating first data representing the relationship between a first measured response value at a first frequency location adjacent the frequency location of the estimated response value;

a second calculating circuit for calculating second data representing the relationship between a second measured response value at a second frequency location adjacent the frequency location of the estimated response value;

a third calculating circuit for calculating third data representing the frequency location of the estimated response value relative to the first and second frequency locations;

a fourth calculating circuit for calculating fourth data representative of the relationship between the estimated response value and the typical response value at the frequency of the estimated response value from the first, second and third data; and a fifth calculating circuit for calculating the estimated response value from the typical response value at the frequency location of the estimated response value and the fourth data.

10. The calibrator of claim 9 wherein:

the first calculating circuit comprises circuitry which calculates $g0=m9/t9$, where $g0$ is the first data, $m9$ is the measure response value at the first frequency location and $t9$ is the typical response value at the first frequency location;

the second calculating circuit comprises circuitry which calculates $g1=m13/t13$, where $g1$ is the second data, $m13$ is the measured response value at the second frequency location and $t13$ is the typical response value at the second frequency location;

the third calculating circuit comprises circuitry which calculates $p=(f11-f9)/(f13-f9)$ where $p$ is the third data, $f11$ is the frequency location of the estimated response value, $f9$ is the first frequency location and $f13$ is the second frequency location;

the fourth calculating circuit comprises circuitry which calculates $s=g0+(p\times(g1-g0))$ where $s$ is the fourth data; and the fifth calculating circuit comprises circuitry which calculates $x11=s\times t11$, where $x11$ is the estimated response value and $t11$ is the typical response value at the frequency of the estimated response value.

* * * * *